United States Patent [19]
Ford et al.

[11] Patent Number: 5,548,285
[45] Date of Patent: Aug. 20, 1996

[54] CIRCUIT AND METHOD OF INDICATING DATA HOLD-TIME

[75] Inventors: David K. Ford, Gilbert; Bernard E. Weir, III, Chandler, both of Ariz.

[73] Assignee: Motorola, Inc., Schaumburg, Ill.

[21] Appl. No.: 276,373

[22] Filed: Jul. 18, 1994

[51] Int. Cl.⁶ .................................................. H03M 9/00
[52] U.S. Cl. ........................ 341/100; 341/101; 371/62; 324/617
[58] Field of Search .................... 341/100, 101; 326/93; 371/62; 327/27; 324/617

[56] References Cited

U.S. PATENT DOCUMENTS 5,291,141  3/1994  Farwell et al. .................. 324/617

*Primary Examiner*—Todd DeBoer
*Attorney, Agent, or Firm*—Robert D. Atkins

[57] ABSTRACT

A parallel to serial converter (10) uses a data hold-time indicator (22) to indirectly observe the timing relationship of the data and clock applied to a data register (14) embedded within an integrated circuit. The incoming data word is converted from CMOS to ECL logic levels (12) and applied to the data register. The register holds data for a multiplexer (16) that rotates through the output data from the register for providing a serial data output signal. A flipflop circuit (18) clocks the serial data output signal. The data hold-time indicator circuit monitors one register input and generates a recurring pulse having a width that reflects the data hold-time at the embedded register. By indirectly observing the timing relationship, the externally sourced data timing can be calibrated to meet the setup and hold-time requirements of the data register.

16 Claims, 2 Drawing Sheets

CIRCUIT AND METHOD OF INDICATING DATA HOLD-TIME

BACKGROUND OF THE INVENTION

The present invention relates in general to digital timing circuits and, more particularly, to a data hold-time indicator circuit that produces a recurring pulse width that reflects the data hold-time of an embedded register.

Parallel-to-serial converters are commonly used in digital circuit design to convert multi-bit signals to a string of data bits that are serially transmitted one at a time. One common application involves a data register embedded within an integrated circuit that periodically receives new data sourced by external logic. Timing generation logic for loading the data register is also embedded within the integrated circuit. The timing generation logic asserts a periodic signal to the external logic requesting more data be presented to the data register.

Many applications involve high speed operation, say in the gigahertz range. The data transaction must be completed within a predetermined time period. The data must be present and valid for a setup time before the data is loaded into the register by a clock signal. In addition, the data must remain present and valid for a hold-time after the transition of the clock signal. Unfortunately at such high data rates, the propagation delay uncertainty of the digital signals from the external sourcing logic are almost as long as the entire transaction period.

When the periodic signal is asserted to request more data, the external logic begins the time-consuming process of retrieving new data. When the external logic finally presents new data to the integrated circuit, the new data typically propagates through buffer logic and eventually reaches the data register. The timing generation logic asserts a clock signal to load the data register. When the data transaction is so fast that propagation delay uncertainties consume almost the entire time period, there is no guarantee that data arrives at the data register within register setup and hold-time constraints.

Since the data register and timing logic are embedded within the integrated circuit, it is difficult to directly measure the actual setup and hold-time. That is, the setup and hold-time are not readily observable by the external logic. If the data setup and hold-time cannot be observed, the data rate of the external sourcing logic must be reduced to ensure sufficient setup and hold-time. The data rate of the external sourcing logic cannot be maximized unless the actual setup and hold-time of the register is known. Otherwise, where the propagation time uncertainty consumes a large portion of the transaction time period, the data transaction may fail to correctly time the data transfer under a worst-case timing analysis.

Hence, a need exists for a circuit that provides data setup and hold-time information for embedded circuits that are otherwise unobservable.

DETAILED DESCRIPTION OF THE PREFERRED EMBODIMENT

Figure 1:
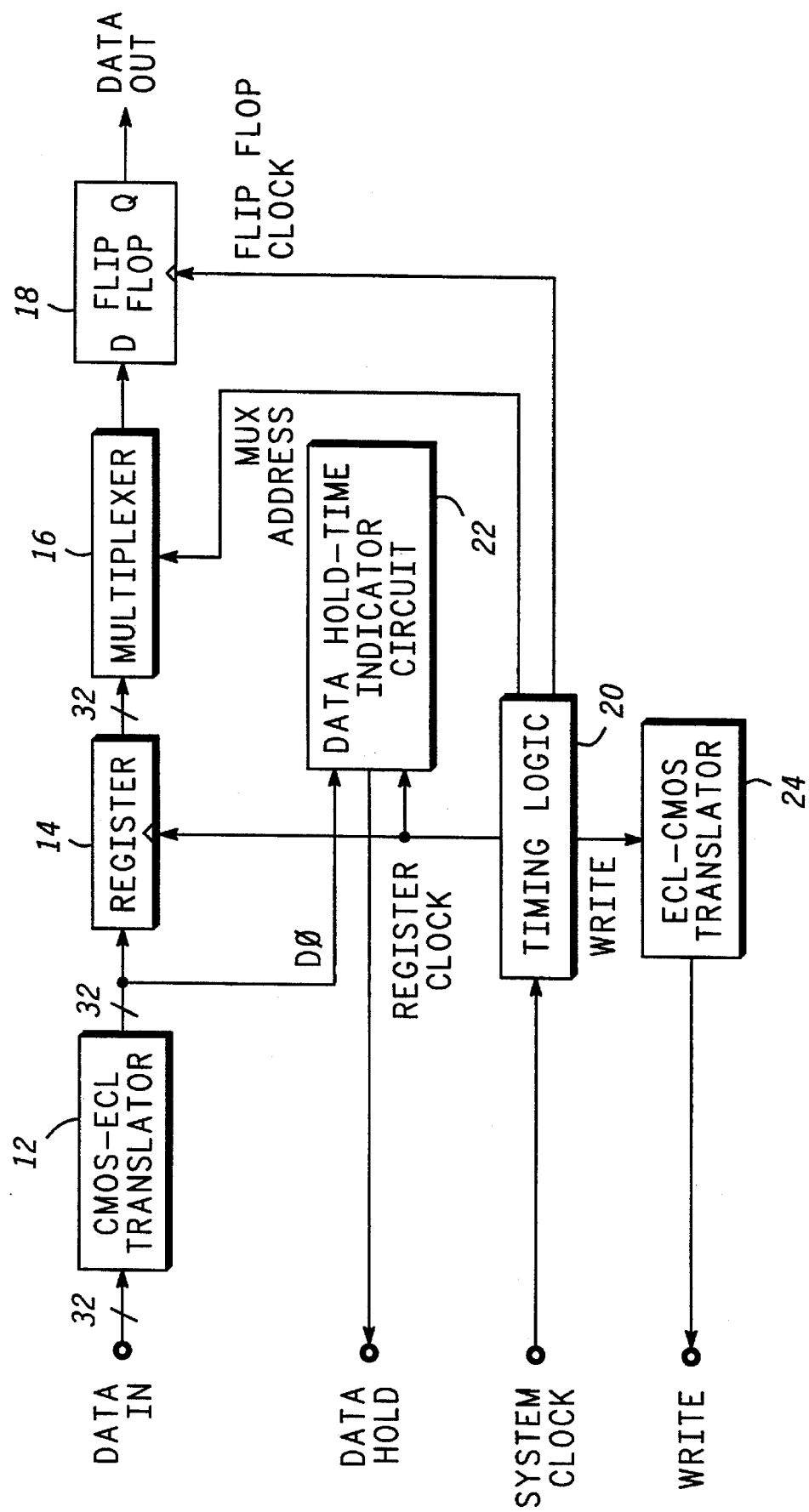
FIG. 1 is a block diagram illustrating a parallel-to-serial converter.

Referring to FIG. 1, a parallel-to-serial converter 10 is shown suitable for manufacturing as an integrated circuit using conventional integrated circuit processes. A CMOS-ECL voltage translator circuit 12 receives a 32-bit DATA IN word from external sourcing logic (not shown) operating at CMOS logic levels. CMOS-ECL voltage translator circuit 12 provides a 32-bit ECL logic level output signal to 32-bit register 14. Register 14 loads data at rising edge of a REGISTER CLOCK signal. Multiplexer 16 rotates through the individual bit locations of register 14 under control of the MUX ADDRESS signal and provides serial bits to the data input of flipflop 18. Flipflop 18 transfers the serial data signal to DATA OUT at its Q-output upon receiving a FLIPFLOP CLOCK signal. Data hold-time indicator circuit 22 receives the least significant D0 bit from CMOS-ECL voltage translator circuit 12 and the REGISTER CLOCK signal for providing a DATA HOLD signal that indicates the data hold-time as the time between the rising edge of the REGISTER CLOCK signal and the transition edge of the D0 bit.

Timing logic 20 operates in response to a SYSTEM CLOCK signal, operating for example at 2.5 gigahertz, for providing the FLIPFLOP CLOCK signal and the REGISTER CLOCK signal. The FLIPFLOP CLOCK signal operates in phase and at the same frequency as the SYSTEM CLOCK. The REGISTER CLOCK signal and the WRITE are derived from dividing the SYSTEM CLOCK by value 32. The MUX ADDRESS is reset to zero with each REGISTER CLOCK and counts up with the SYSTEM CLOCK to value 32. Thus, the serialized data stream DATA OUT is sent at the SYSTEM CLOCK frequency with the duration of each serial bit time the same as the period of the SYSTEM CLOCK. Timing logic 20 further asserts a WRITE control signal every thirty-two SYSTEM CLOCK signals. ECL-CMOS translator 24 converts the WRITE control signal from ECL logic levels to CMOS logic levels for the external logic to send the next DATA IN word. Timing logic 20 includes combination logic to divide the SYSTEM CLOCK and reset the MUX ADDRESS signal. Such combinational logic can be implemented from the aforedescribed operations.

It is important for the overall circuit operation that the output signal from REGISTER 14 does not become metastable. The 32-bit data at the output of CMOS-ECL voltage translator circuit 12 must be stable for a finite "setup time" before the rising edge of REGISTER CLOCK. Likewise, the 32-bit data must remain stable for a finite "hold-time" after the rising edge of REGISTER CLOCK. Any violation of setup and hold-time may cause the REGISTER 14 output to become metastable, yielding indeterminate logic levels for an indeterminate time duration.

Accordingly, as a feature of the present invention, data hold-time indicator circuit 22 provides a DATA HOLD signal that represents the actual data hold-time as the time between the rising edge of the REGISTER CLOCK signal and the transition edge of the D0 bit. Thus, the DATA HOLD signal provides a mechanism of determining the actual data hold-time of register 14 without directly observing data transitions within the embedded circuit. Once the actual data hold-time is accurately determined, the external sourcing logic can be set to provide the DATA IN signal as fast as parallel-to-serial converter 10 can handle it given the required set-up and hold-time of register 14.

Figure 2:
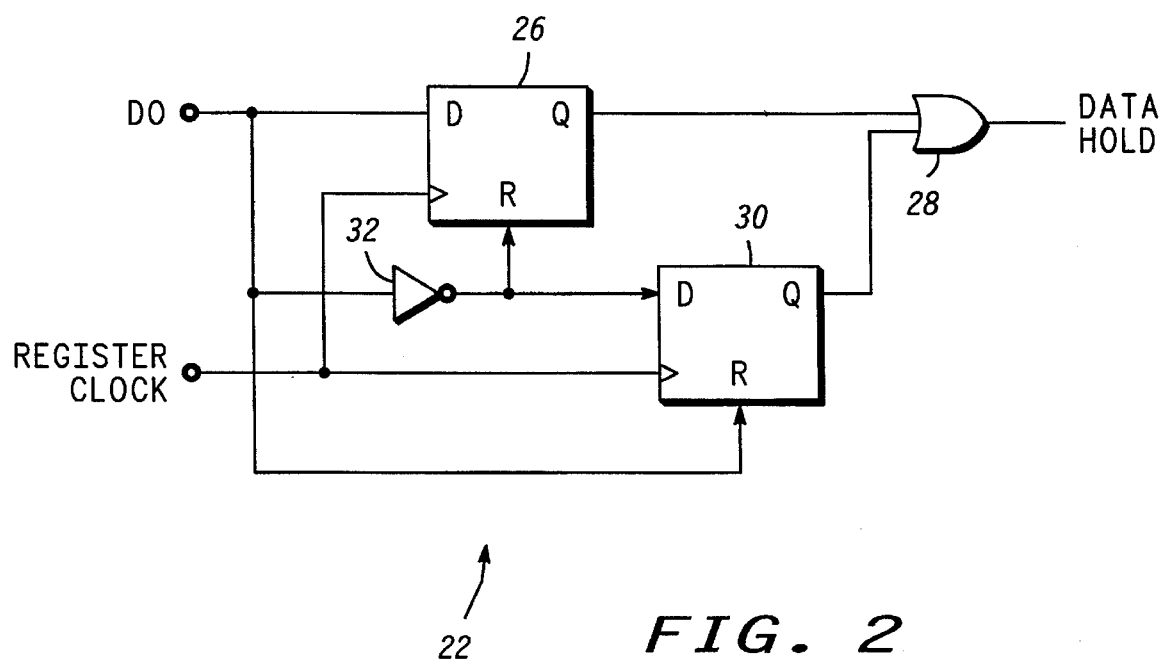
FIG. 2 is a schematic diagram illustrating the data hold-time indicator circuit of FIG. 1.

Turning to FIG. 2, further detail of data hold-time indicator circuit 22 is shown including flipflop 26 having a data input coupled for receiving the D0 bit from CMOS-ECL voltage translator circuit 12. The Q-output of flipflop 26 is coupled to a first input of OR gate 28. The D0 bit is applied to the reset input of flipflop 30. The D0 bit is further inverted by inverter 32 and applied to the reset input of flipflop 26 and to the data input of flipflop 30. The REGISTER CLOCK signal is applied to the clock inputs of flipflops 26 and 30. The Q-output of flipflop 30 is coupled to a second input of OR gate 28 for providing the DATA HOLD signal at its output.

The data hold-time is typically determined during test. The D0 bit is toggled between zero and one with successive 32-bit DATA IN test vectors to determine the data hold-time for the integrated circuit given the process technology. Assuming the D0 bit starts as logic one. When REGISTER CLOCK rises from logic zero to logic one, the Q-output of flipflop 26 goes to logic one. At the same time, the logic one D0 bit resets flipflop 30 and produces a logic zero at the second input of OR gate 28. The logic one from flipflop 26 causes the DATA HOLD signal to go to logic one. The rising transition of the DATA HOLD pulse reflects the time when the REGISTER CLOCK goes high. When the D0 bit goes to logic zero, the output of inverter 32 goes to logic one and resets the Q-output of flipflop 26 to logic zero. However, the logic one at the output of inverter 32 does not propagate through flipflop 30 until the next rising edge of the REGISTER CLOCK signal. The logic zero at the first input of OR gate 28 causes the DATA HOLD signal to go to logic zero. The trailing edge of the DATA HOLD pulse reflects the time at which the data changed at the input to register 14. Thus, the overall pulse width of DATA HOLD represents the data hold-time of register 14 as the time between the rising edge of the REGISTER CLOCK signal and the transition edge of the D0 bit Alternately, if the D0 bit starts as logic zero, the data input receives a logic one from inverter 32. The Q-output of flipflop 30 goes to logic one at the rising edge of the REGISTER CLOCK signal. At the same time, the logic one from inverter 32 resets flipflop 26 and produces a logic zero at the first input of OR gate 28. The logic one from flipflop 30 causes the DATA HOLD signal to go to logic one. The rising transition of the DATA HOLD pulse reflects the time when the REGISTER CLOCK goes high. When the D0 bit goes to logic one, the Q-output of flipflop 30 is reset to logic zero. However, the logic one D0 bit does not propagate through flipflop 26 until the next rising edge of the REGISTER CLOCK signal. The logic zero at the second input of OR gate 32 causes the DATA HOLD signal goes to logic zero. The trailing edge of the DATA HOLD pulse reflects the time at which the data changed at the input of register 14. Again, the overall pulse width of DATA HOLD represents the data hold-time of register 14 as the time between the rising edge of the REGISTER CLOCK signal and the transition edge of the D0 bit The data hold-time determination is useful during design and development where the DATA HOLD signal may be observed with an oscilloscope. If the DATA HOLD pulse is much narrower than one half of the total period of the SYSTEM CLOCK, then there is too little hold-time and too much setup time. A delay circuit may be added in the external sourcing logic for the WRITE control signal to delay application of DATA IN and balance the observed setup and hold-time. Likewise, for too much hold-time and too little setup time, the solution may optimize external logic to eliminate delays, or reduce the operating frequency, to balance setup and hold-time.

By now it should be appreciated that the present invention provides a circuit and method of indirectly observing the timing relationship of the data and clock applied to a register embedded within an integrated circuit. The invention generates a recurring pulse having a width that reflects the data hold-time at the input to the embedded register. By indirectly observing the timing relationship, the externally-sourced data timing can be calibrated to meet the setup and hold-time requirements of the embedded register.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A data hold-time indicator circuit, comprising:
    a first flipflop having a data input, a clock input, a reset input and an output, said data input being coupled for receiving a data input signal, said clock input being coupled for receiving a clock signal, said reset input being coupled for receiving an inverted data input signal;
    a second flipflop having a data input, a clock input, a reset input and an output, said data input being coupled for receiving said inverted data input signal, said clock input being coupled for receiving said clock signal, said reset input being coupled for receiving said data input signal; and
    a logic gate having first and second inputs and an output, said first input being coupled to said output of said first flipflop, said second input being coupled to said output of said second flipflop, said output providing a data hold-time signal.

2. The data hold-time indicator circuit of claim 1 further including an inverter having an input coupled for receiving said data input signal and having an output for providing said inverted data input signal.

3. A method of observing timing relationship between a clock signal and a data signal, comprising the steps of:
    detecting a clocking edge of the clock signal;
    detecting a transition of the data signal; and
    generating a hold-time indicator pulse having a duration determined by a difference between said clocking edge of the clock signal and said transition of the data signal.

4. The method of claim 3 wherein said step of generating a hold-time indicator pulse includes the step of setting the data signal to a first state.

5. The method of claim 4 wherein said step of generating a hold-time indicator pulse includes the step of storing said first state of the data signal in a first flipflop upon receiving said clocking edge of said clock signal.

6. The method of claim 5 wherein said step of generating a hold-time indicator pulse further includes the step of resetting a second flipflop in response to said first state of the data signal.

7. The method of claim 6 wherein said step of generating a hold-time indicator pulse further includes the step of combining output signals of said first and second flipflops with a logical OR operation to generate a first edge of said hold-time indicator pulse.

8. The method of claim 7 wherein said step of generating a hold-time indicator pulse further includes the step of changing the data signal to a second state.

9. The method of claim 8 wherein said step of generating a hold-time indicator pulse further includes the step of resetting said first flipflop in response to said second state of the data signal.

10. The method of claim 9 wherein said step of generating a hold-time indicator pulse further includes the step of combining said output signals of said first and second flipflops with a logical OR operation to generate a second edge of said hold-time indicator pulse.

11. A parallel to serial converter circuit, comprising:

a register having inputs receiving a data word, said register loading said data word in response to a register clock signal;

a multiplexer having inputs coupled to outputs of said register, said multiplexer rotating through said inputs in response to a multiplexer control signal for providing serial data signals at an output; and circuit means having an input receiving one bit of said data word and said clock signal for generating a hold-time pulse having a duration determined by a difference between a clocking edge of said register clock signal and a trailing edge of said one bit of said data word.

12. The parallel to serial converter circuit of claim 11 wherein said circuit means includes:

a first flipflop having a data input, a clock input, a reset input and an output, said data input receiving said one bit of said data word, said clock input receiving said register clock signal, said reset input receiving an inverted one bit of said data word;

a second flipflop having data input, a clock input, a reset input and an output, said data input receiving said inverted one bit of said data word, said clock input receiving said register clock signal, said reset input receiving said one bit of said data word; and a logic gate having first and second inputs and an output, said first input being coupled to said output of said first flipflop, said second input being coupled to said output of said second flipflop, said output providing a data hold-time signal.

13. The parallel to serial converter circuit of claim 12 wherein said circuit means further includes an inverter having an input receiving said one bit of said data word and having an output for providing said inverted one bit of said data word.

14. The parallel to serial converter circuit of claim 13 further including a first logic level translator circuit having inputs receiving said data word and having outputs coupled to said inputs of said register.

15. The parallel to serial converter circuit of claim 14 further including a third flipflop having a data input, a clock input, and an output, said data input being coupled to said output of said multiplexer, said clock input being receiving a flipflop clock signal, said output providing a data output signal.

16. The parallel to serial converter circuit of claim 15 further including a logic circuit for generating said register clock signal, said flipflop clock signal, and said multiplexer control signal in response to a system clock signal.

* * * * *